(12) United States Patent
Chen

(10) Patent No.: US 6,179,915 B1
(45) Date of Patent: Jan. 30, 2001

(54) ON TRACK COATER UNIT CUP SET

(75) Inventor: Brad Chen, Hsinchu (TW)

(73) Assignees: ProMos Technology, Inc; Mosel Vitelic Inc, both of Hsinchu (TW); Siemens AG, Munich (DE)

(*) Notice: Under 35 U.S.C. 154(b), the term of this patent shall be extended for 0 days.

(21) Appl. No.: 09/268,743

(22) Filed: Mar. 13, 1999

(30) Foreign Application Priority Data

Nov. 17, 1998 (TW) .................................. 87218958

(51) Int. Cl.⁷ .................................................. B05C 13/02
(52) U.S. Cl. .......................... 118/52; 118/56; 118/319; 118/320; 118/500; 134/902
(58) Field of Search .............................. 118/52, 56, 319, 118/320, 500; 134/902; 427/240

(56) References Cited

U.S. PATENT DOCUMENTS

| 4,899,686 | * | 2/1990 | Toshima et al. ....................... 118/52 |
| 5,908,661 | * | 6/1999 | Batcheldor et al. .................. 427/240 |
| 5,947,136 | * | 9/1999 | Abras .................................... 134/902 |

* cited by examiner

Primary Examiner—Laura Edwards
(74) Attorney, Agent, or Firm—W. Wayne Liauh

(57) ABSTRACT

A track coater unit cup set for using in a wafer spin coating process comprises a hollow concave circular base cup, a hollow convex circular inner cup, and a hollow convex circular outer cup. The base cup has an inner circular groove with an inner groove wall and an eccentric outer circular groove with an outer circular groove wall. The inner cup capable of resting upon the base cup by engaging a downward protruding ring with the inner groove wall of the base cup on a meshing interface in between. The outer cup for shielding above top of the inner cup and capable of resting upon the base cup has a central top opening and a ring of inward tip extruding downward from an edge of the outer cup for forming the top opening. A stall-flow region is defined between the inward tip and adjacent insides of the outer cup. The meshing interface further includes at least a set of anchoring means for avoiding relative slipping between the base cup and the inner cup. The outer cup further includes disturbing means in the stall-flow region for altering air flow thereinside.

20 Claims, 5 Drawing Sheets

ON TRACK COATER UNIT CUP SET

BACKGROUND OF THE INVENTION (1) Field of the Invention

The invention relates to a track coater unit cup set, which is utilized in IC fabrication processes, especially in a spinning process; and more particularly to a modified track coater unit cup set in which the induced solvent spraying accuracy and the resulted cleanliness on the wafer in the involving process can be greatly improved by little reworking on the cup set profile.

(2) Description of the Prior Art

In the coating processes of a wafer in the semi-conductor industry, spin coating is the general application in adding a thin film or membrane on the wafer. Such a thin film can be a photoresist, etching agent, or the like to coat over the wafer surface. In the spin application of the art, the wafer is positioned upon a vacuum susceptor, and the chemical solvent to form the film is dropped from top of the wafer while it rotates with the susceptor driven by a rotation mechanism. During the spinning, at least a spray post located under the susceptor is used to provide cleaning solvent spray onto the rim of the wafer, so that the chemical residues over the rim can be washed out at the same time. By proving such a cleaning spray, possible inaccurate problems close to rim of the wafer can be reduced to a minimum.

In the conventional arrangement of a spin facility, it generally involves a track coater unit cup set to work with the cleaning solvent spray for reducing the possibility of the solvent contaminating the wafer or the spin facility Referring now to FIG. 1, a track coater unit cup set and the related part of the rotation mechanism are shown exposedly. As shown, the track coater unit cup set 1 on top of the rotation mechanism 2 is a kit with three circular parts. The first part is a hollow concave base cup 11 capable of anchoring on the rotation mechanism 2, the second is a hollow convex inner cup 13 located on top of the base cup 11, and the third is a hollow convex outer cup 15 to envelope the inner cup 13 and to be placed on top of the base cup 11. In piling the track coater unit cup set I onto the rotation mechanism 2 for application, the base cup 11 is firstly fixed to the rotation mechanism 2. Secondly, the inner cup 13 with the maximum diameter less than that of the base cup 11 is placed on top of the base cup 11. Thirdly, engage a susceptor 21 with a shaft 23 over the inner cup 13, in which the shaft 23 is extended from the rotation mechanism 2 and through the hollow openings of the base cup 11 and the inner cup 13. The susceptor 21 is used to carry a wafer (not shown in 15 FIG. 1) on top for undertaking a spin coating process. Finally, the outer cup 15 is used to go with the base cup 11 for forming an internal space in between to include the inner cup 13 and the susceptor 21 as well as the wafer thereinside.

Referring now to FIG. 2, a cross sectional view of the assembly of the track coater unit cup 1 and the rotation mechanism 2 is shown. As shown, the base cup 11 rides on the rotation mechanism 2 and has the central opening for top of the rotation mechanism 2 to penetrate. The base cup 11 further includes two concentric circular grooves: an inner circular groove 111 and an outer circular groove 113. An inner wall of the inner circular groove 111 is defined as an inner groove wall 115. On the other hand, the outer surface of the inner cup 13 is used as a flow-leading surface. As shown in FIG. 2, the inner cup 13 has an inner downward protruding ring 1311 for engaging with the inner groove wall 115 of the base cup 11 through a first step-shape engaging structure established along the meshing interface 1110 between the top edge of the inner groove wall 115 and the lower end of the protruding ring 1311. The outer lower end of the inner cup 13 is designed to suspend in the outer circular groove 113 of the base cup 11, so that the cleaning solvent can be led into the outer circular groove 113 through the outer surface of the inner cup 13, after the solvent hitting the rim of the wafer 3. The accumulated cleaning solvent is then led out through a hole (not shown in figures) on the bottom of the outer circular groove 113. The upper central opening of the inner cup 13 is defined as an upper opening 131, through which the driving shaft 23 of the rotation mechanism 2 can penetrate. At the upper end of the shaft 23, there locates the susceptor 21 for vacuuming the wafer 3 on top thereof. The area of the upper opening 131 is no more than either that of the top of the rotation mechanism 2 or that of the wafer 3. The outer cup 15 is used to enclose totally the outer circular groove 113 of the base cup 11. Generally, the lower end of the outer cup 15 engages with the top end of the outer wall of the outer circular groove 113 (also the outer wall of the base cup 11) through a second step-shape engaging structure 1113 formed in-between. The upper central opening of the outer cup 15 is defined as a top opening 151. The space formed between the outer cup 15 and the inner cup 13 is defined as a working space 350, in which the wafer 3 undergoes the coating process. The rim of the outer cup 15 to form the upper opening 151 further includes a ring of short inward tip 153 protruding into the working space 350. The purpose of the inward tip 153 is to substantially smooth out the airflow introduced into the working space 350 through the upper opening 151.

During a coating process, the susceptor 21 as well as the wafer 3 is rotated by the shaft 23 of rotation mechanism 2. Photoresist or other chemical for forming a thin film on the wafer 3 is added through the top opening 151. By the rotation induced centrifugal force, photoresist or other chemical can be spread to cover the whole wafer 3. In order to achieve smoothness and to avoid possible splash of the photoresist and other chemical, a ventilation system (not shown in figures) for vacuuming the working space 350 can be provided to the bottom of the base cup 11. To avoid the photoresist or other chemical to residue at the rim of the wafer 3 (which may induce particle contamination and the planarization problems on the wafer 3 thereafter), the rotation mechanism 2 usually includes a pair of spray posts 25 for providing cleaning solvent spray 251 onto the rim of the wafer 3. For the spray 251 to penetrate the upper opening 131 and arrive at the rim of the wafer 3, the inner cup 13 further has a pair of respective apertures 133 located along the inner rim thereof. The cleaning solvent spray 251 is provided by the spray posts 25, hits the rim of the wafer 3, and then drops between the inner cup 13 and the outer cup 15. The cleaning solvent together with the residue photoresist or other chemical then flow into the outer circular groove 113 of the base cup 11. Finally, the cleaning solvent together with the residue photoresist or other chemical are led out of the track coater unit cup set 1 from the bottom of the base cup 11.

In the aforesaid structure, the track coater unit cup set 1 generally has two disadvantages. One is the misalignment problem between the spray 251 and the aperture 133, and the other is the aggregation and solidification of the solvent at the comer close to and at the inward tip 153.

Regarding the misalignment between the spray 251 and the apertures 133, the problem results from the angular shifting between the base cup 11 and the engaged inner cup 13, due to the vibration caused the driving system of the rotation mechanism 2. Furthermore, the light weight on the inner cup 13 (usually made of plastic or non-metallic material), which contributes to less normal force on the meshing interface 1110 and thus less friction force thereon to prevent from the relative motion between the inner cup 13 and the base cup 11, makes worse the angular shifting problem. As a consequence of the angular shifting, the spray 251 injected from the spray post 25 cannot normally pass through the corresponding aperture 133, but hits the inner wall of the inner cup 13; so that insufficient solvent flow can be provided to clean the rim of the wafer 3 and the contamination problem on the rotation mechanism 2 may arise. In the literature, two measures have been provided to resolve the misalignment problem. One is to frequently caliber the angling between the base cup 11 and the inner cup 13, the other is to enlarge the aperture 133. However, the former measure will result in the decrease of the manufacturing effectiveness, and the later measure will inevitably increase the coming-back solvent amount through the enlarged aperture 133. None of them can really ease this disadvantage.

Regarding the aggregation problem close to and at the inward tip 153, the reason that causes the aggregation of the solvent is the unique geometrical profile in the neighborhood of the inward tip 153. By the analysis of the fluid dynamics, a certain amount of drifting micro liquid drops will be generated wile the spray 251 breaks through the air in the working space 3501 and after the spray 251 hits the rim of the wafer 3. Such drifting drops may be driven by the turbulence to circulate within the so-called stall-flow region 3501 formed close to the inward tip 153 and the inner wall of the outer cup 15. The micro drifting drops in the stall-flow region 3501 will eventually aggregate to form a bigger droplet and then drop into the outer circular groove 113 of the base cup 11. However, in another aspect, the micro drifting drops will aggregate on the inner wall of the inward tip 153, and will fall onto and contaminate the wafer 3 after a substantial amount of solvent accumulated on the inward tip 153. Otherwise, the solvent residue on the inward tip 153 will solidify and form a possible particle source to contaminate the following wafer 3 in the same process. To overcome the aggregation problem at the inward tip 153, frequently or daily washing the outer cup 15 is proposed. However, such a resolution usually makes busy the maintenance personnel, and reduces the application rate of the coating facility.

SUMMARY OF THE INVENTION

Accordingly, it is an object of the present invention to provide a modified track coater unit cup set, which can reduce the possibility of contaminating the wafer and the coating facility by the cleaning solvent.

It is yet another object of the present invention to provide a modified track coater unit cup set, which can waive the angular shifting problem between the base cup and the inner cup by applying an anchoring mechanism located at their meshing interface.

It is a further object of the present invention to provide a modified track coater unit cup set, which can reduce the aggregating problem of the micro drifting drops of the cleaning solvent at the inward tip by adding disturbing means to the stall-flow region.

According to the present invention, the track coater unit cup set includes also a base cup, an inner cup, and an outer cup. On the meshing interface between the base cup and the inner cup, at least a set of anchoring mechanism is included for avoiding any relative shifting motion between these two cups. The anchoring means of the invention can be key-and-keyway means, bulge-and-indent means, pin-and-pinhole means, or the like.

According to the present invention, the outer cup comprises at least a disturbing means at the stall-flow region for altering the disturbance flow of the micro drifting drops of the cleaning solvent, such that the aggregating problem of the solvent at the inward tip can be greatly released.

According one embodiment of the present invention, the disturbing means can be a disturbing ring extruding from the inner wall of the outer cup toward the stall-flow region. The cross section of the disturbing ring can be shaped as an invert-triangle, a semi-circle, a rectangle, or the like.

According to one embodiment of the present invention, the disturbing means can be an insert to stuff the stall-flow region, partially or completely. By providing such an insert, the stall-flow region can be shrunk to a substantially minimal area for reducing the amount of the micro drifting drops within the stall-flow region.

BRIEF DESCRIPTION OF THE DRAWINGS

The present invention will now be specified with reference to its preferred embodiments illustrated in the drawings, in which.

DESCRIPTION OF THE PREFERRED EMBODIMENT

The invention disclosed herein is directed to a modified track coater unit cup. In the following description, numerous details are set forth in order to provide a thorough understanding of the present invention. It will be appreciated by one skilled in the art that variations of these specific details are possible while still achieving the results of the present invention. In other instances, well-known components are not described detail in order not to unnecessarily obscure the present invention.

In coherence with the previous description of the track coater unit cup set in the background section, following detailed description will apply same numerals and names to the same parts.

The track coater unit cup set in accordance with the present invention is applied to a spin coating facility. It includes a base cup, an inner cup, and an outer cup. All these three cups have the same basic structures as respective conventional cups described above in the background section. Here, in the detailed description, will not put effort on re-describing them.

According to the present invention, at least a set of anchoring mechanism is included on the meshing interface between the base cup and the inner cup, for avoiding any relative shifting motion between these two cups. Moreover, the outer cup comprises at least a disturbing means at the stall-flow region for altering the disturbance flow of the micro drifting drops of the cleaning solvent, such that the aggregating problem of the solvent at the inward tip can be greatly released.

Figure 1:
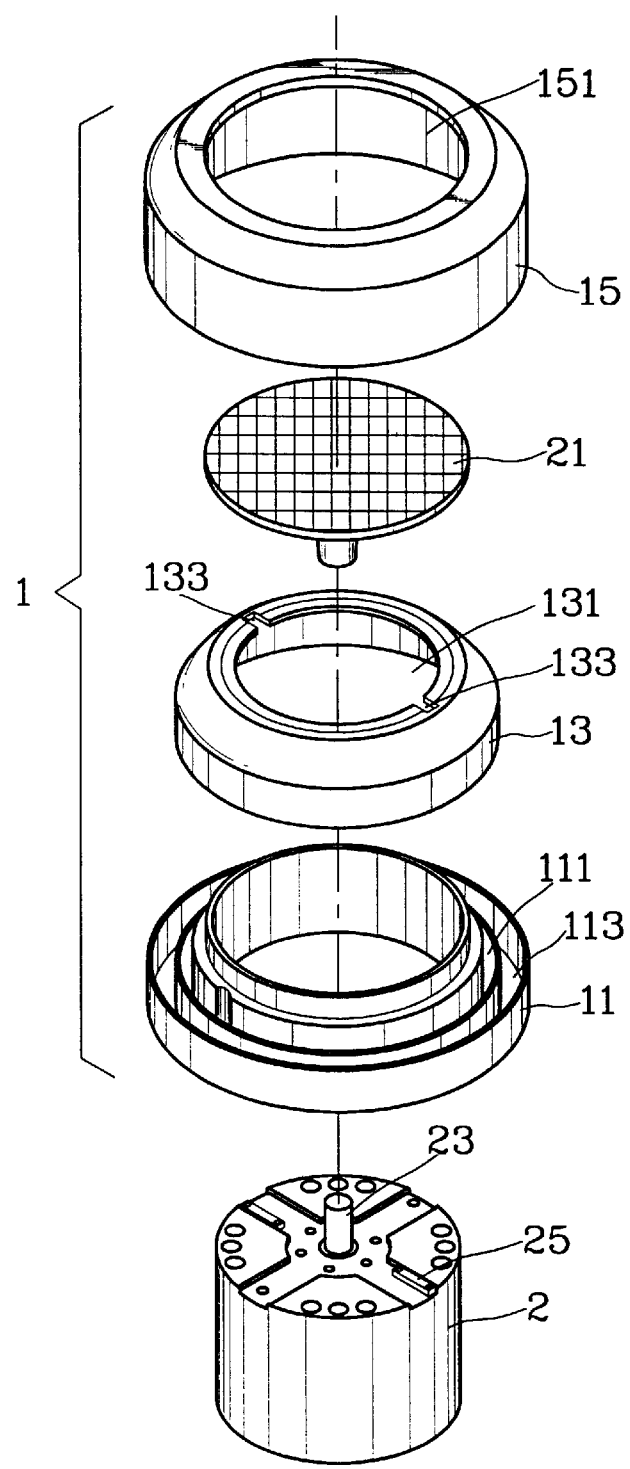
FIG. 1 is a perspective exploded view of the track coater unit cup set and the rotation mechanism of the coating facility.
Figure 2:
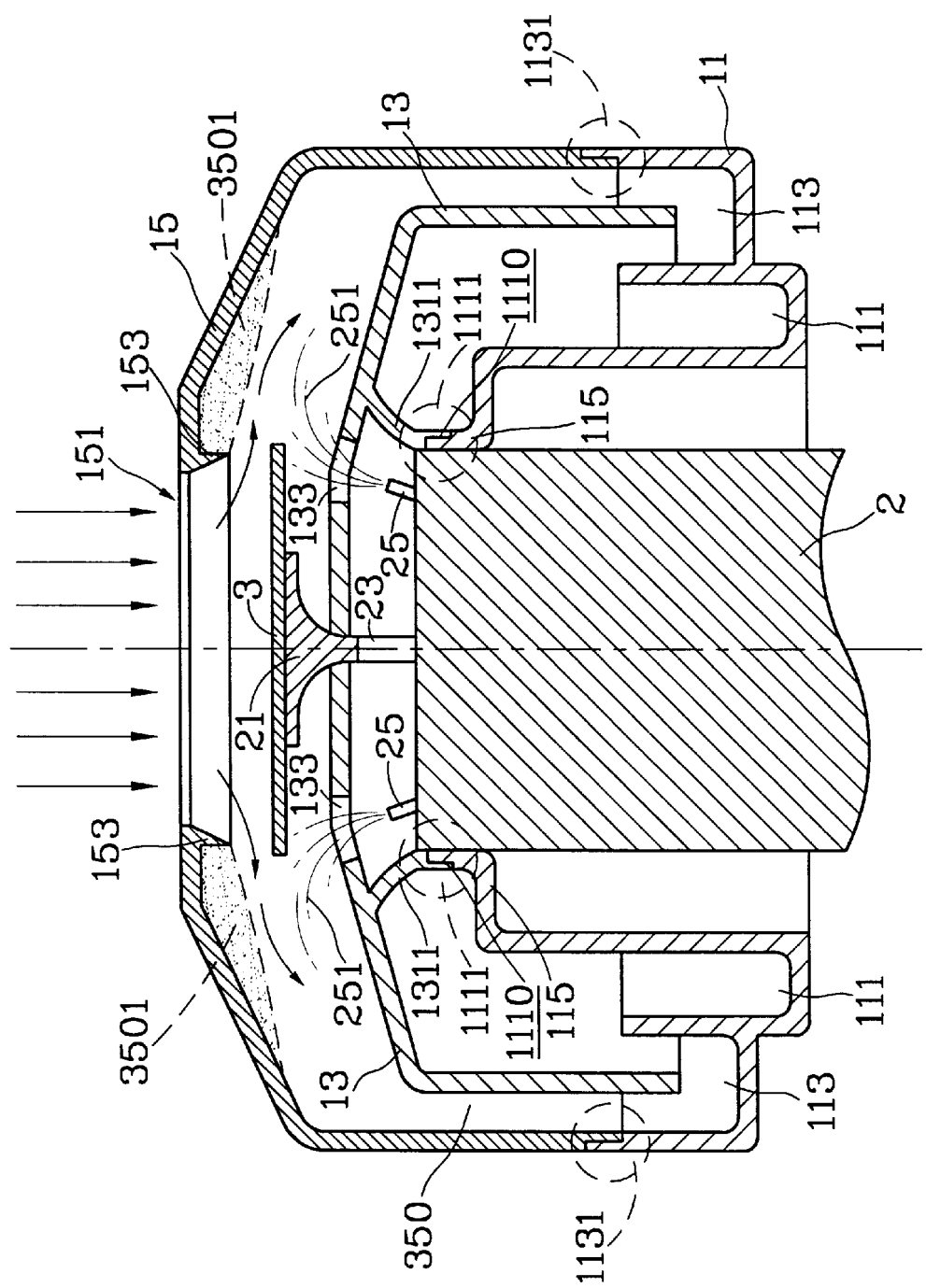
FIG. 2 is a cross sectional view of the track coater unit cup set and the rotation mechanism in operation.
Figure 3:
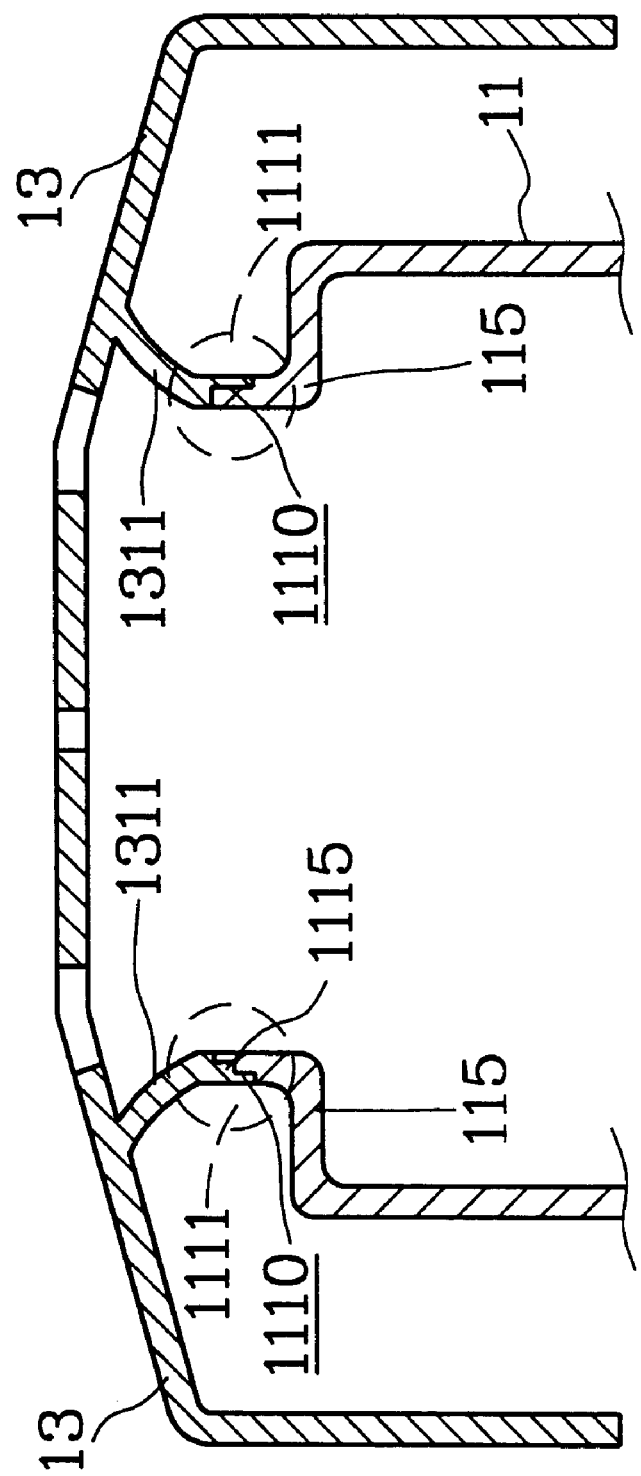
FIG. 3 is a cross sectional view of an anchoring means in accordance with the present invention.

Referring now to FIG. 3, the anchoring means 1115 is located on the meshing interface 1110 between the bottom end of the protruding ring 1311 and the top end of the inner groove wall 115; i.e. located in the first step-shape engaging structure 1111 between the base cup 11 and the inner cup 13. According to the present invention, the existence of the anchoring means 1115 can be local-wise (shown only at left side of the first step-shape engaging structure 1111 in FIG. 3), section-wise, or any alternative that can establish obstacles for exhibiting relative slipping between the base cup 11 and the inner cup 13. The anchoring means 1115 can be embodied as key-and-keyway engaging means, bulge-and-indent engaging means, pin-and-pinhole engaging means, or any engaging means with a part on the base cup 11 and a counter part on the inner cup 13. For example, if the anchoring means is a key-and-keyway means on an appropriate location on the meshing interface 1110, the key can be arranged on the bottom end of the protruding ring 1311 and the counter keyway is then arranged on the top end of the inner groove wall 115. Or, the keyway can be arranged on the bottom end of the protruding ring 1311 and the counter key is then arranged on the top end of the inner groove wall 115. One more requirement for constructing the part and the counter part of the anchoring means 1115 is that the spray 251 from the spray post 25 can pass smoothly through the respective aperture 133.

Figure 4:
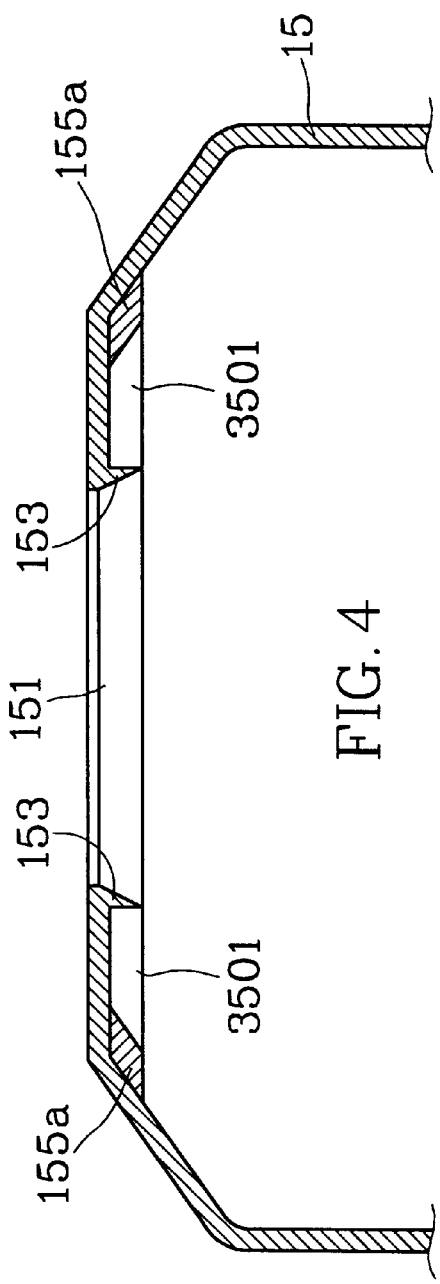
FIG. 4 is a cross sectional view of the first embodiment of the disturbing means in accordance with the present invention.
Figure 5:
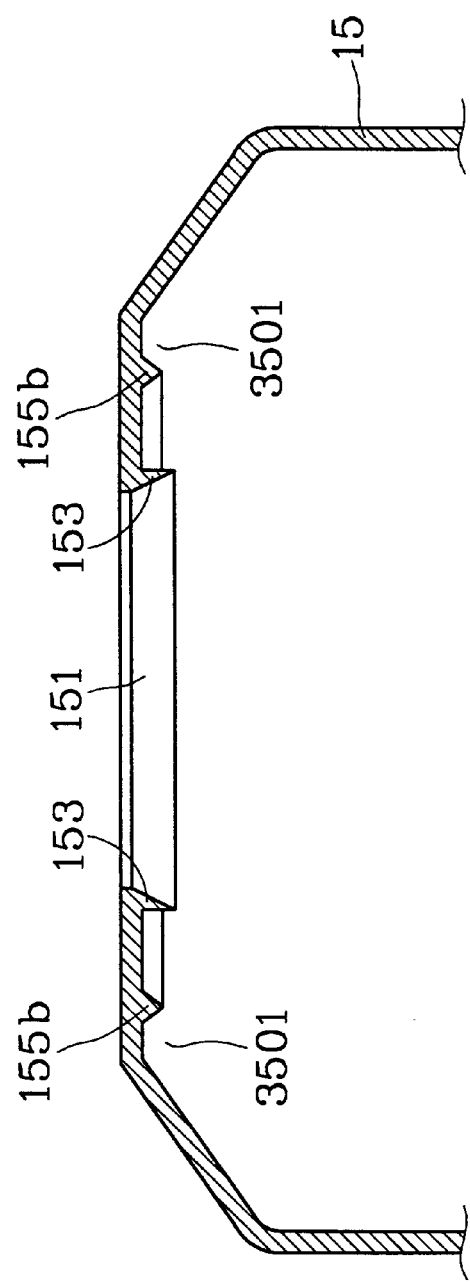
FIG. 5 is a cross sectional view of the second embodiment of the disturbing means in accordance with the present invention.
Figure 6:
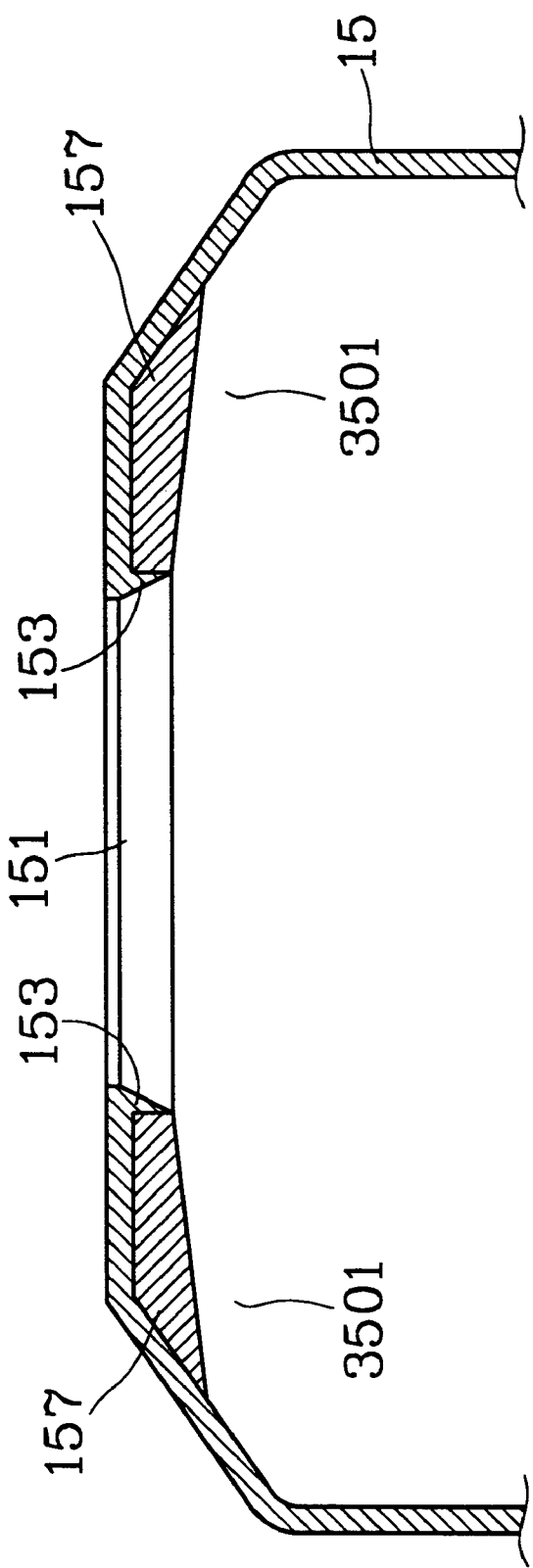
FIG. 6 is a cross sectional view of the third embodiment of the disturbing means in accordance with the present invention.

Referring now to FIG. 4 and FIG. 5, the first and the second embodiments of the disturbing means in accordance with the present invention are shown respectively. As shown, the disturbing means is embodied as at least a disturbing ring 155a or 155b extruding from the inner wall of the outer cup 15 in the stall-flow region 3501. The cross section of the disturbing ring 155a or 155b can be shaped as an invert-triangle as shown in FIG. 5, a semi-circle, a rectangle as shown in FIG. 4, or the like. The construction of the disturbing rings 155a and 155b is to intersect the original stall-flow region 3501, so that the stall-flow region is separated and minimized in total (according to the empirical theorem of fluid dynamics). Also, by providing the disturbing rings 155a and 155b, the circulation of the micro drifting drops of the solvent adjacent to the inward tip 153 can be reduced to a lesser amount. Moreover, the location to construct the disturbing means in the original stall-flow region 3501 can be at the comer as shown in FIG. 4, the middle portion as shown in FIG. 5, or any other appropriate location in the stall-flow region. Referring now to FIG. 6, the disturbing means can also be an insert 157 to stuff the stall-flow region 3501, partially or completely. By providing such an insert 157, the stall-flow region 3501 can be shrunk to a substantially minimal area or none for reducing the amount of the micro drifting drops within the original stall-flow region 3501; so that the aggregating problem at the inward tip 153 can be resolved.

While the present invention has been particularly shown and described with reference to preferred embodiments, it will be understood by those skilled in the art that various changes in form and detail may be without departing from the spirit and scope of the present invention.

I claim:

1. A track coater unit cup set for using on a rotation mechanism of a spin coating machine, comprising:

a hollow concave circular base cup capable of anchoring on the rotation mechanism, having an inner circular groove with an inner groove wall and an eccentric outer circular groove surrounding the inner circular groove and having an outer circular groove wall;

a hollow convex circular inner cup capable of resting upon the base cup by engaging a downward protruding ring thereof with the inner groove wall of the base cup, defining a meshing interface between a lower end of the protruding ring and a top end of the inner groove wall; and a hollow convex circular outer cup for shielding above top of the inner cup and capable of resting upon the base cup by engaging a bottom end thereof with an upper end of the outer circular groove wall, defining a coating working space formed between the inner cup and the outer cup, having a central top opening, an edge of the outer cup for forming the top opening further having a ring of inward tip extruding downward thereof, and defining a stall-flow region between the inward tip and adjacent insides of the outer cup;

wherein the meshing interface further having at least a set of anchoring means for avoiding relative slipping between the base cup and the inner cup, and wherein the outer cup further having disturbing means in the stall-flow region for altering air flow thereinside.

2. The track coater unit cup set of claim 1, wherein said anchoring means include a key located at the inner cup and a counter key way located at the base cup.

3. The track coater unit cup set of claim 1, wherein said anchoring means include a key way located at the inner cup and a counter key located at the base cup.

4. The track coater unit cup set of claim 1, wherein said anchoring means include a bulge located at the inner cup and a counter indent located at the inner cup.

5. The track coater unit cup set of claim 1, wherein said anchoring means include a bulge located at the base cup and a counter indent located at the inner cup.

6. The track coater unit cup set of claim 1, wherein said anchoring means include a pin located at the base cup and a counter pinhole located at the inner cup.

7. The track coater unit cup set of claim 1, wherein said anchoring means include a pinhole located at the base cup and a counter pin located at the inner cup.

8. The track coater unit cup set of claim 1, wherein said disturbing means include at least a disturbing ring extruding downward from the outer cup.

9. The track coater unit cup set of claim 1, wherein said disturbing means include an insert stuffing a upper portion of the stall-flow region.

10. The track coater unit cup set of claim 1, wherein said disturbing means include an insert stuffing completely the stall-flow region.

11. A track coater unit cup set applicable in a wafer spin coating process, comprising a base cup having an inner circular groove, an inner cup for resting upon the inner circular groove, and an outer cup for engaging with the base cup and shielding above top of the inner cup, the inner cup having a downward protruding ring thereof for providing a lower end to engage a top end of an inner groove wall of the inner circular groove, defining a meshing interface between the lower end of the protruding ring and the top end of the inner groove wall, and wherein the meshing interface further having at least a set of anchoring means for avoiding relative slipping between the base cup and the inner cup.

12. The track coater unit cup set of claim 11, wherein said anchoring means include a key located at the inner cup and a counter key way located at the base cup.

13. The track coater unit cup set of claim 11, wherein said anchoring means include a key way located at the inner cup and a counter key located at the base cup.

14. The track coater unit cup set of claim 11, wherein said anchoring means include a bulge located at the inner cup and a counter indent located at the base cup.

15. The track coater unit cup set of claim 11, wherein said anchoring means include a bulge located at the base cup and a counter indent located at the inner cup.

16. The track coater unit cup set of claim 11, wherein said anchoring means include a pin located at the base cup and a counter pinhole located at the inner cup.

17. The track coater unit cup set of claim 11, wherein said anchoring means include a pinhole located at the base cup and a counter pin located at the inner cup.

18. A track coater unit cup set applicable in a wafer spin coating process, comprising a base cup, an inner cup, and a outer cup for shielding above top of the inner cup and capable of resting upon the base cup, defining a coating working space formed between the inner cup and the outer cup, the outer cup having a central top opening, an edge of the outer cup for forming the top opening further having a ring of inward tip extruding downward thereof, the outer cup defining a stall-flow region between the inward tip and adjacent insides of the outer cup, wherein the outer cup further having disturbing means in the stall-flow region for altering air flow thereinside.

19. The track coater unit cup set of claim 18, wherein said disturbing means include at least a disturbing ring extruding downward from the outer cup.

20. The track coater unit cup set of claim 18, wherein said disturbing means include an insert stuffing the stall-flow region.

* * * * *